United States Patent
Benham et al.

(10) Patent No.: US 6,573,801 B1
(45) Date of Patent: Jun. 3, 2003

(54) ELECTROMAGNETIC COUPLER

(75) Inventors: John R. Benham, Westborough, MA (US); Nandu J. Marketkar, Boylston, MA (US); Rajeevan Amirtharajah, Providence, RI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/714,899

(22) Filed: Nov. 15, 2000

(51) Int. Cl.⁷ .................................................. H01P 5/12
(52) U.S. Cl. ..................... 333/24 R; 333/116
(58) Field of Search ............................. 333/24 R, 116, 333/238, 246, 27; 375/257

(56) References Cited

FOREIGN PATENT DOCUMENTS

WO  PCT/US01/50873  11/2002

*Primary Examiner*—Robert Pascal
*Assistant Examiner*—Joseph Chang
(74) *Attorney, Agent, or Firm*—Blakely, Sokoloff, Taylor & Zafman LLP

(57) ABSTRACT

An electromagnetic (EM) coupler including a first transmission structure having a first geometry, and a second transmission structure having a second geometry and forming an EM coupler with the first transmission structure, the first and second geometries being selected to reduce sensitivity of EM coupling to relative positions of the first and second transmission structures is disclosed.

8 Claims, 14 Drawing Sheets

US 6,573,801 B1

ELECTROMAGNETIC COUPLER

FIELD OF INVENTION

This invention is related to the field of electromagnetic coupling devices for bus communication.

BACKGROUND OF THE INVENTION

Electromagnetic coupling devices enable energy to be transferred between components of a system via interacting electric and magnetic fields. These interactions are quantified using coupling coefficients. The capacitive coupling coefficient is the ratio of the per unit length coupling capacitance, $C_m$, to the geometric mean of the per unit length capacitances of the two coupled lines, $C_l$. Similarly, the inductive coupling coefficient is the ratio of the per unit length mutual inductance, $L_m$, to the geometric mean of the per unit length inductances of the two coupled lines, $L_l$.

FIG. 1 shows a conventional broadside coupler, where the two broadest faces of two adjacent printed circuit board conductor lines are electromagnetically coupled. FIG. 2 shows an edge coupler, where the narrow faces of two conductors on the same layer are coupled.

Conventional coupling devices suffer from deficiencies in several areas. The coupling devices exhibit significant variations in the capacitive coupling coefficient due to manufacturing tolerances in the line geometry and in the relative position of the two coupled lines ("x,y,z variations"). Furthermore, in common manufacturing practices, the width of conductors is subject to variations of between +/−0.5 and +/−1.0 mils, the relative alignment of conductor layers within a printed circuit board (PCB) is subject to variations of +/−5 mils (x,y axis), the distance between conductor layers can vary by +/−2 mils (z axis), and the location of holes for guide pins is subject to +/−4 mil variations (x,y axis). Therefore, conventional couplers are too sensitive to misalignment to be used in computer systems.

The present invention addresses these and other deficiencies of conventional couplers.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

An electromagnetic (EM) coupler is disclosed. For one embodiment, the EM coupler includes a first transmission structure having a first geometry and a second transmission structure having a second geometry, which may be different than the first geometry. An EM coupling is formed between the first and second transmission structures. For one embodiment, the first and second geometries are selected to reduce sensitivity of EM coupling to relative positions of the first and second transmission structures. The EM coupler structure may be physically separated into two component halves to be used in an interconnect application.

For one embodiment, the EM coupler provides a broadband coupling device that is separable, bi-directional, and provides robust performance despite misalignment of the transmission structures. The coupler may further have an impedance that is controlled over a wide frequency range to prevent losses from reflections. Thus, the coupler may be used to transmit and receive digital signals.

For one embodiment, the EM coupler also provides bi-directional signal transfer; i.e. the transmission properties of the coupler are essentially the same in the forward and reverse signal transfer directions. For one embodiment, the line impedance of the EM coupler is compatible with the circuitry of a computer system.

Figure 3:
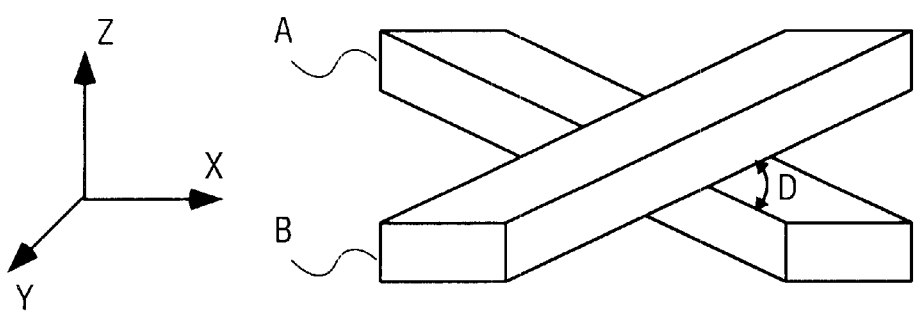
FIGS. 3, 4, and 5 show embodiments of a portion of a coupler including two conductors.
Figure 4:
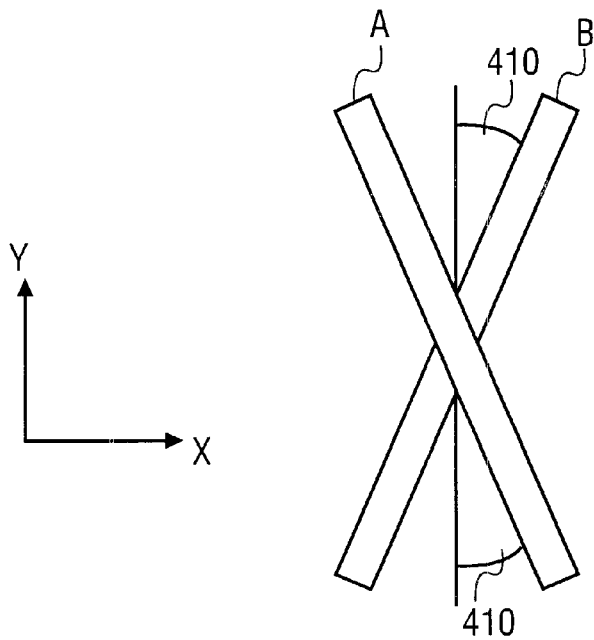

FIG. 3 shows a coupler that includes an arrangement of sections of two conductors A and B separated by a dielectric such as air, for example. FIG. 4 shows a top view of the sections of the conductors. As shown in FIG. 4, conductor A is rotated by an angle 410 from the common longitudinal axis, while conductor B is rotated by an equal but opposite angle 410 from the same common longitudinal axis.

Figure 5:
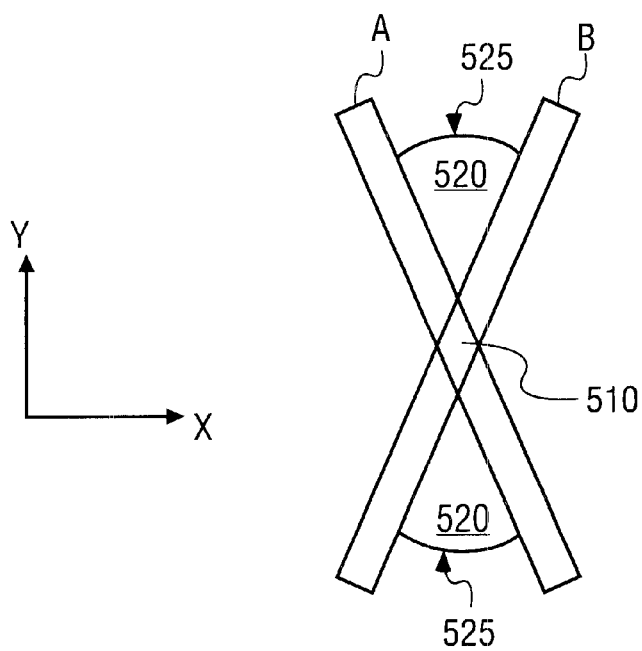

FIG. 5 shows a coupler having a total capacitance that includes a parallel plate capacitance and a fringe capacitance. In overlapping area 510, the capacitance contribution from the overlapping sections of the conductors is generally similar to that of a parallel plate capacitor with parallelogram shaped plates. The capacitance between the conductors A and B in regions 520 is a fringe capacitance. The outer bounding edges 525 show the points where the added fringe capacitance between the two conductors A and B becomes negligible, e.g. less than 0.1%, of the total capacitance of the coupler.

The combination of the parallel plate capacitance and the fringe capacitance provides a nearly constant coupling capacitance in the face of deviations from a nominal position. This constant coupling capacitance provides robust coupling even if the conductors are misaligned. Therefore, the two conductors can be moved relative to each other in the x and y directions, without a significant change in their mutual capacitive coupling coefficient.

This constant coupling coefficient behavior under x, y translation holds providing that the lengths of the two conductors are such that no disturbing feature, such as, for example, the end of either conductor or a bend in either of the conductors, falls into the overlapping area 510 or the fringe regions 520 of the conductors in such a manner as to significantly perturb the parallel plate and the fringe capacitance contributions. However, if a disturbing feature is present, the coupler may still function, but the coupling coefficient may change significantly and the performance may be degraded.

Figure 1:
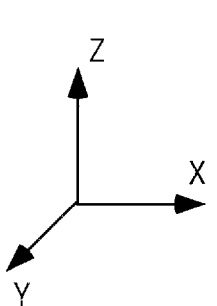
FIG. 1 shows a prior art broadside coupler.
Figure 1:
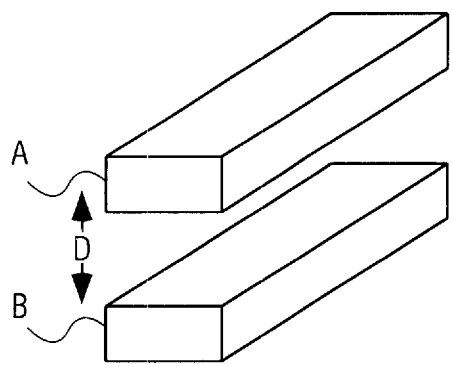
Figure 2:
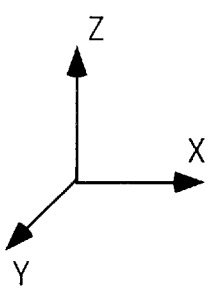
FIG. 2 shows a prior art edge coupler.
Figure 2:
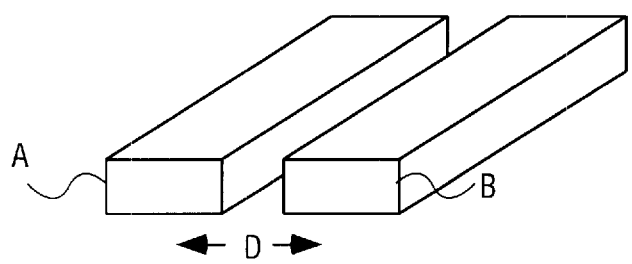

If the vertical separation distance d between the two conductors is increased, the contribution of the parallel plate component in the region 510 in FIG. 5 decreases as a function of 1/d. However, the fringe capacitance in regions 520 of FIG. 5 can contribute as much as 25% of the total coupling capacitance between the conductors. The distance between surface elements of the conductors in the fringe capacitance regions is determined by both the conductor separation distance d and the selected angle 410. The fringe capacitance contribution changes at a rate significantly less than 1/d. The rate of change in the coupling coefficient between conductors A and B, as shown in FIG. 5, separated by a distance d and rotated by a selected angle 410, is therefore significantly less than the rate of change between couplers having broadside or edge configurations, as shown in FIGS. 1 and 2, where nearly all of the coupling capacitance shows a 1/d dependency.

Figure 6A:
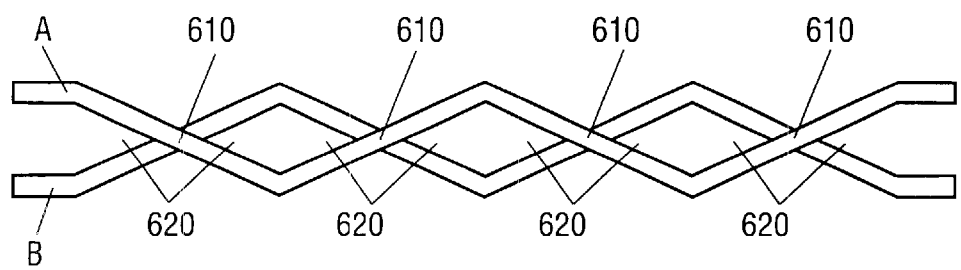
FIGS. 6A, 6B, and 7 show embodiments of multiple crossed coupler segments.
Figure 6B:
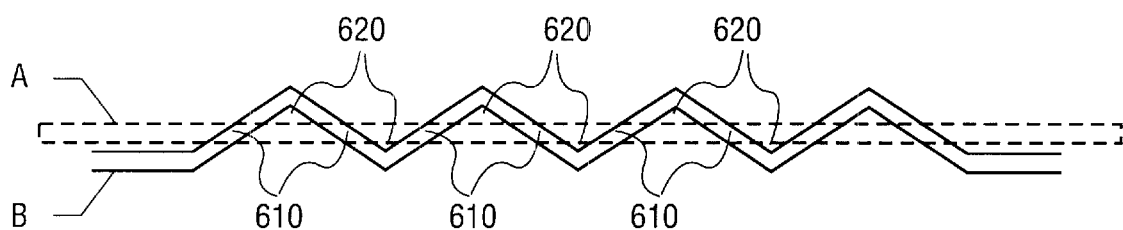

The coupling coefficient may be increased by the use of multiple crossed coupler segments for a fixed length of coupler region as shown in FIG. 6A. Referring to FIG. 6A, a conductor A has been formed from multiple connected segments lying in a plane, where adjacent segments are arranged with an alternating angular displacement about the longitudinal axis of the conductor. A second similarly segmented conductor B is separated from conductor A by a dielectric at some predetermined distance, with its segments lying in a plane parallel to that of conductor A and arranged so that the angular displacement of its segments are in the opposite sense to the corresponding segments in conductor A, to form the zig-zag structure shown in FIG. 6A. The structures from conductor A and conductor B have their longitudinal axes aligned collinearly in their nominal position, as shown in FIG. 6A. (Alternatively, one conductor may have a zig-zag geometry, and the other conductor may have a straight line geometry. This alternative embodiment is shown in FIG. 6B, which shows a coupler having one straight conductor A, and also another conductor B, which is segmented in a zig-zag geometry.)

By providing a number of parallel plate capacitance regions 610 and fringe capacitance regions 620 per unit length, the geometry shown in FIG. 6A increases the capacitive coupling coefficient available between the coupled conductors A and B, while retaining the alignment insensitivity characteristics of the coupler shown in FIG. 5.

In addition to the capacitive coupling coefficient, the coupler also has an inductive coupling coefficient, which is derived from the mutual inductance between the conductors and the self inductance of each conductor. The mutual inductance describes the energy that is magnetically transferred from one conductor to the other. For example, a time-varying electric current flowing through one conductor generates a time-varying magnetic field which causes an electric current to flow through the other conductor. The self inductance describes the energy that is stored when an electric current flows through a conductor and generates a magnetic field.

The inductive coupling coefficient, which is the ratio of the mutual inductance between the conductors to the geometric mean of the self inductance of each individual conductor, is also proportional to the geometric mean distance between the conductors. The mutual inductance is proportional to the length of the coupler conductors. The capacitive and inductive parameters of a structure with a given geometry are determined by the material properties of the structure. Therefore, once a structure has been designed with an appropriate geometry to obtain a desired set of capacitive parameters, the inductive parameters are also determined.

The interaction of the capacitive and inductive coupling characteristics becomes significant, especially at higher frequencies. This interaction results in directivity for the coupler. By controlling the length of the coupler to be a preferred fraction of a wavelength at a desired lower frequency, the relative magnitude of energy flow in the forward and reverse directions on the receiving conductor of the coupler (directivity) is determined over a preferred frequency range. For example 1 cm of length provides approximately 3 dB directivity over a frequency range of 400 megahertz (MHz) to 3 gigahertz (GHz).

Figure 7:
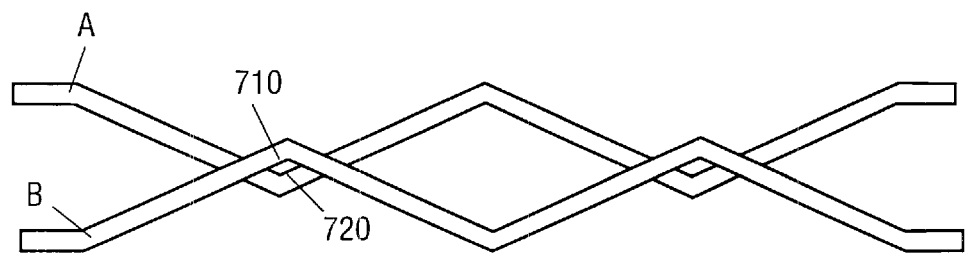

The magnitude of the coupling coefficient for the coupler shown in FIG. 6A remains substantially unchanged over a large range of relative x and y displacements of the conductors A and B as long as the distance between the adjacent edges of the two conductors is greater than a given distance. In the limiting case shown in FIG. 7, an increase in the coupling coefficient begins to occur when the x, y displacement becomes sufficiently large to bring the adjacent edges 710 and 720 of the conductors A and B into close proximity. The range of x, y displacements for which the coupling coefficient remains essentially constant is therefore controlled by selection of an appropriate segment length, such as 0.125 cm for example, and an appropriate displacement angle, such as 35 degrees, for example. Further, by selection of appropriate values for the conductor widths, conductor separation and number of segments, a range of coupling coefficients may be obtained.

Figure 8:
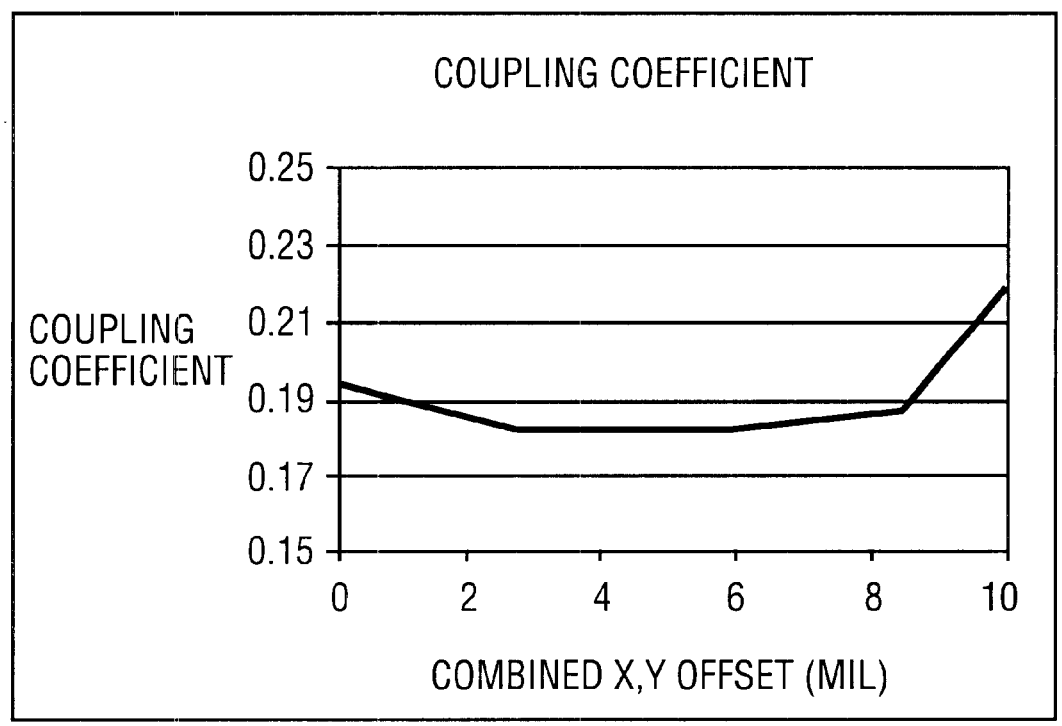
FIGS. 8 and 9 show variations in capacitive coupling coefficient.

For example, FIG. 8 shows the computed variation in capacitive coupling coefficient for a coupler composed of 5 mil wide conductors. The x and y dimension offsets in FIG. 8 are up to 8 mils. In this range, the variation in the capacitive coupling coefficient is less than +/−2% about the average.

Figure 9:
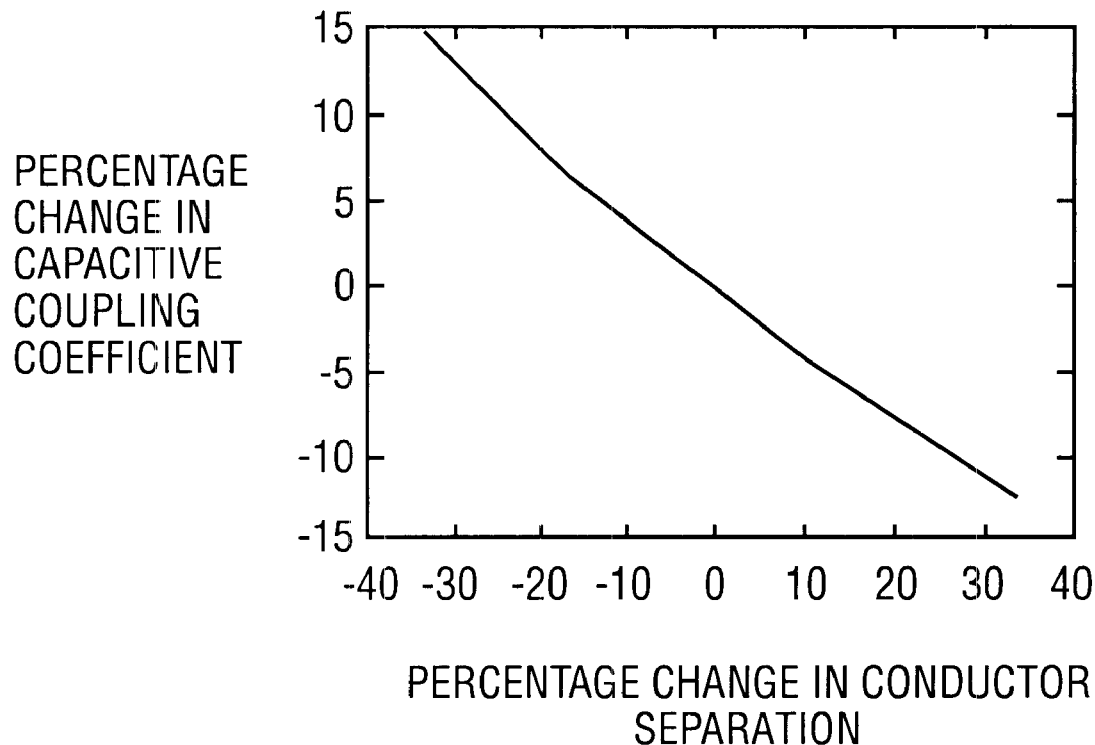

FIG. 9 shows the computed variation in capacitive coupling coefficient with a change in the separation distance between the coupler conductors in the z axis. It shows that for a +/−30% change in conductor separation, the capacitive coupling coefficient varies by less than +/−15%. This compares with parallel plate based geometries shown in FIGS. 1 and 2 which show a +40/−30% variation over the same range of conductor separations.

In addition to the stability of the coupling coefficients of the geometry shown in FIG. 6A, several alternative geometries may be used in the coupler structure. These alternative geometries may reduce far-field electromagnetic radiation, increase broadband behavior of the coupler, reduce impedance discontinuities, and enable the use of alternate materials for improved performance and flexibility.

Figure 10A:
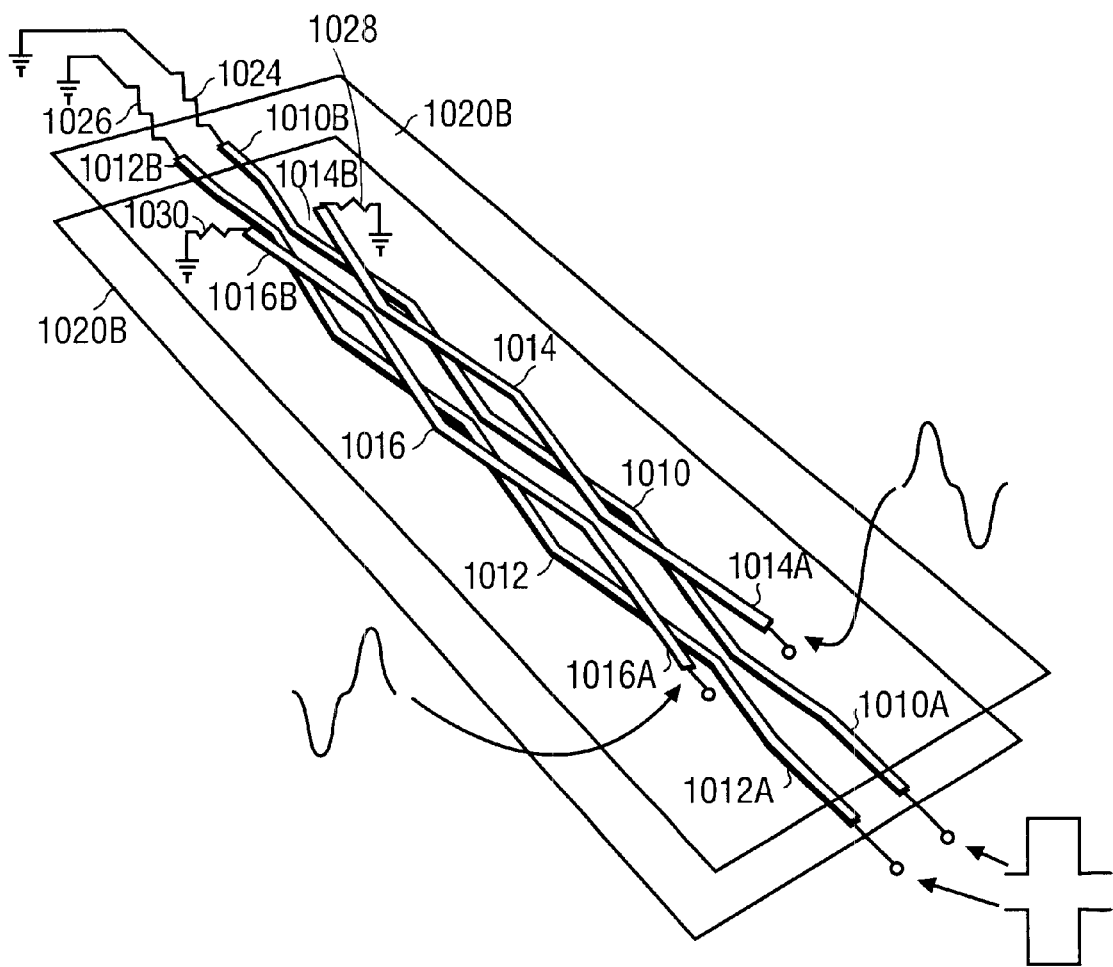
FIGS. 10A and 10B show embodiments of a coupler.

One embodiment of an alternative geometry for the EM coupler is shown in FIG. 10A. Referring to FIG. 10A, the EM coupler includes a differential pair of conductors 1010 and 1012. Conductor 1010 is coupled to a second conductor 1014, while conductor 1012 is coupled to a second conductor 1016. A first reference plane 1019 is placed below the first set of conductors 1010, 1012, to act as a return conductor for these transmission lines. A second reference plane 1020 is placed above the second set of conductors 1014 and 1016 to act as a return conductor for the transmission lines 1014 and 1016. Ends 1010B and 1012B of the first conductors 1010 and 1012 are terminated with matched termination resistors 1024 and 1026. Ends 1014B and 1016B of the second set of conductors are also terminated with matched resistors 1028 and 1030.

A differential digital signal is applied to ends 1010A and 1012A of the first conductors, and a resulting differential coupled signal is then observed at the set of conductor ends 1014A and 1016A. Conversely, a differential digital signal is applied to ends 1014A and 1016A of the second conductors, and a resulting differential coupled signal is then observed at the set of conductor ends 1010A and 1012A. Thus, the first and second set of conductors are reciprocally coupled by their electromagnetic fields. Alignment insensitivity of the coupler aids differential signaling by reducing mismatches between the coupler formed by conductors 1010 and 1014 and the coupler formed by conductors 1012 and 1016.

The differential coupler shown in FIG. 10A reduces the effects of radiation. The use of differential signaling, with anti-phased currents flowing in the differential conductor pair, causes the radiation to fall rapidly to zero as the distance from the differential pair is increased. The differential signaling version of the coupler therefore offers lower far-field electromagnetic radiation levels than a single ended implementation. In addition to this differential embodiment, the coupler may be used in a single ended implementation, where a single conductor couples electromagnetically to a single conductor, as shown in FIG. 6A.

In addition, the effects of far-field radiation may be further reduced by selecting an even number of conductor segments (e.g., eight segments) for the coupler. Thus offers potentially lower far field electromagnetic radiation levels compared to an implementation using an odd number of conductor segments.

The structure of FIG. 10A, which couples the differential signals, has a differential pair of conductors that alternately approach each other and then turn away. Because the conductors 1014 and 1016 of the second transmission structure have segments with equal and opposite angular displacements to conductors 1010 and 1012, respectively, this structure reduces the effects of capacitive crosstalk between conductors 1010 and 1016 and conductors 1012 and 1014 due to misalignment from X,Y variation of the conductors.

Figure 10B:
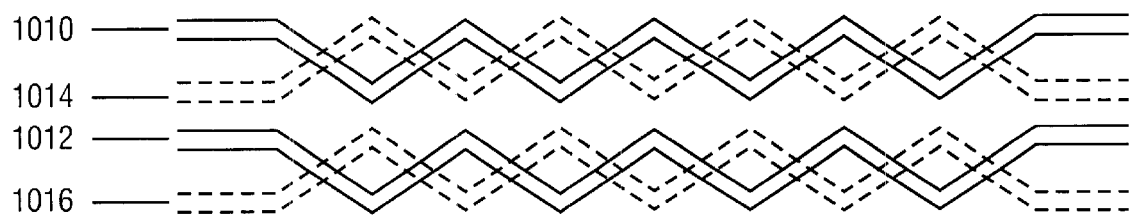

FIG. 10B shows an alternative geometry to the embodiment of FIG. 10A. In FIG. 10B, the pair of differential conductors 1010 and 1012 have a segmented, angular rotated structure. Each segment of one conductor from the pair has an angular displacement such that the segment is parallel to a corresponding segment of the other conductor of the pair of conductors. This results in a differential pair where the conductors maintain parallel positions to each other throughout the length of the coupler. In this configuration, the conductors 1014 and 1016 of the second transmission structure have segments with equal and opposite angular displacements to conductors 1010 and 1012, respectively, while also keeping corresponding segments of conductors 1014 and 1016 parallel to each other. However, this alternative embodiment of FIG. 10B is subject to greater sensitivity to capacitive crosstalk than the embodiment of FIG. 10A.

For one embodiment, the coupler is designed to avoid impedance discontinuities, or changes in the electromagnetic field structure, by not using connections between multiple printed circuit board (PCB) layers, and avoiding abrupt (right angle) bends. (However, in an alternative embodiment, a coupler may be designed with discontinuities or changes in field structure.) The discontinuity effects of the small angular bends in between the coupler segments is further reduced by chamfering the outer edge of the bend slightly to keep the conductor width reasonably constant throughout the bend.

Figure 11A:
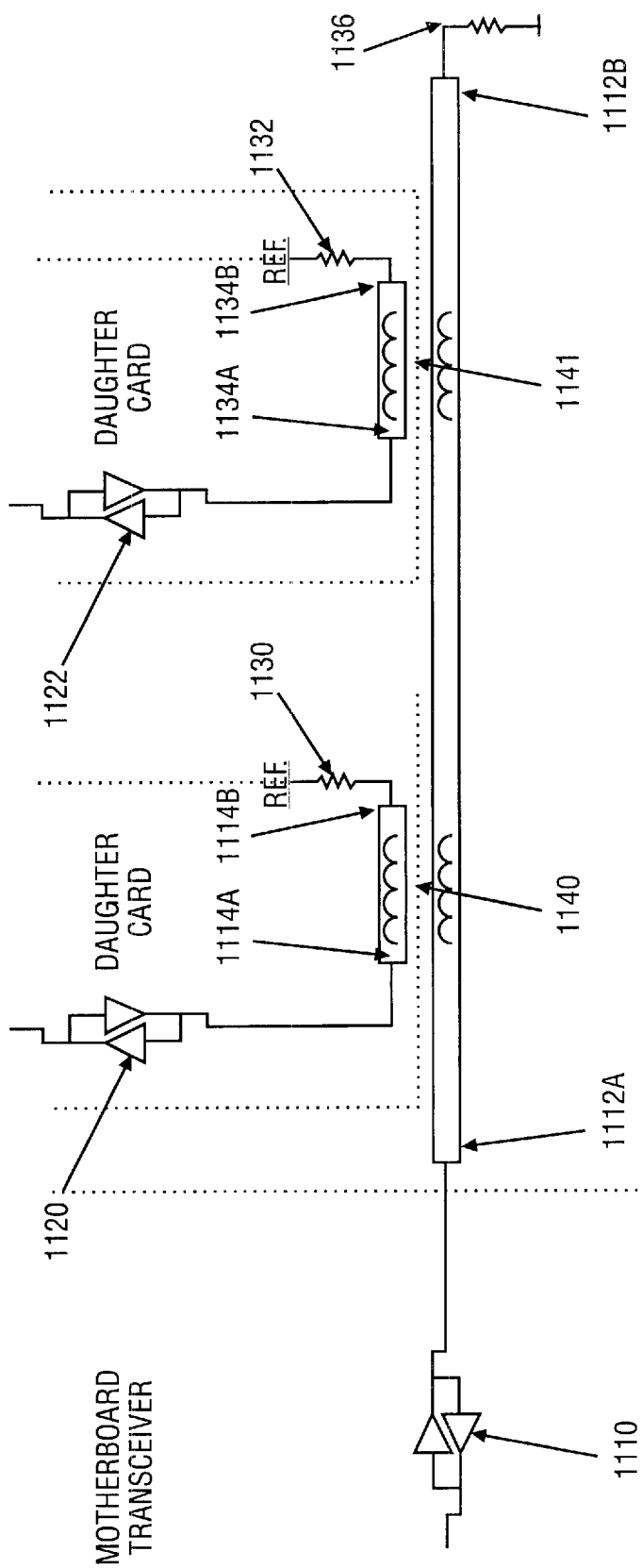
FIGS. 11A and 11B show a digital bus communication system having multiple couplers.

FIG. 11A represents electrical properties of an embodiment of a system that includes multiple couplers in a digital bus communications system. A conductor 1112, which may be on the motherboard of a computer, for example, incorporates two or more couplers 1140, 1141 along its length. The end 1112A of the conductor 1112 on the motherboard is connected to a transceiver 1110 to permit the transmission or reception of digital signals in a bi-directional manner. The end 1112B of the conductor 1112 on the motherboard is terminated with a resistor 1136 equal to the impedance of the conductor.

Figure 11B:
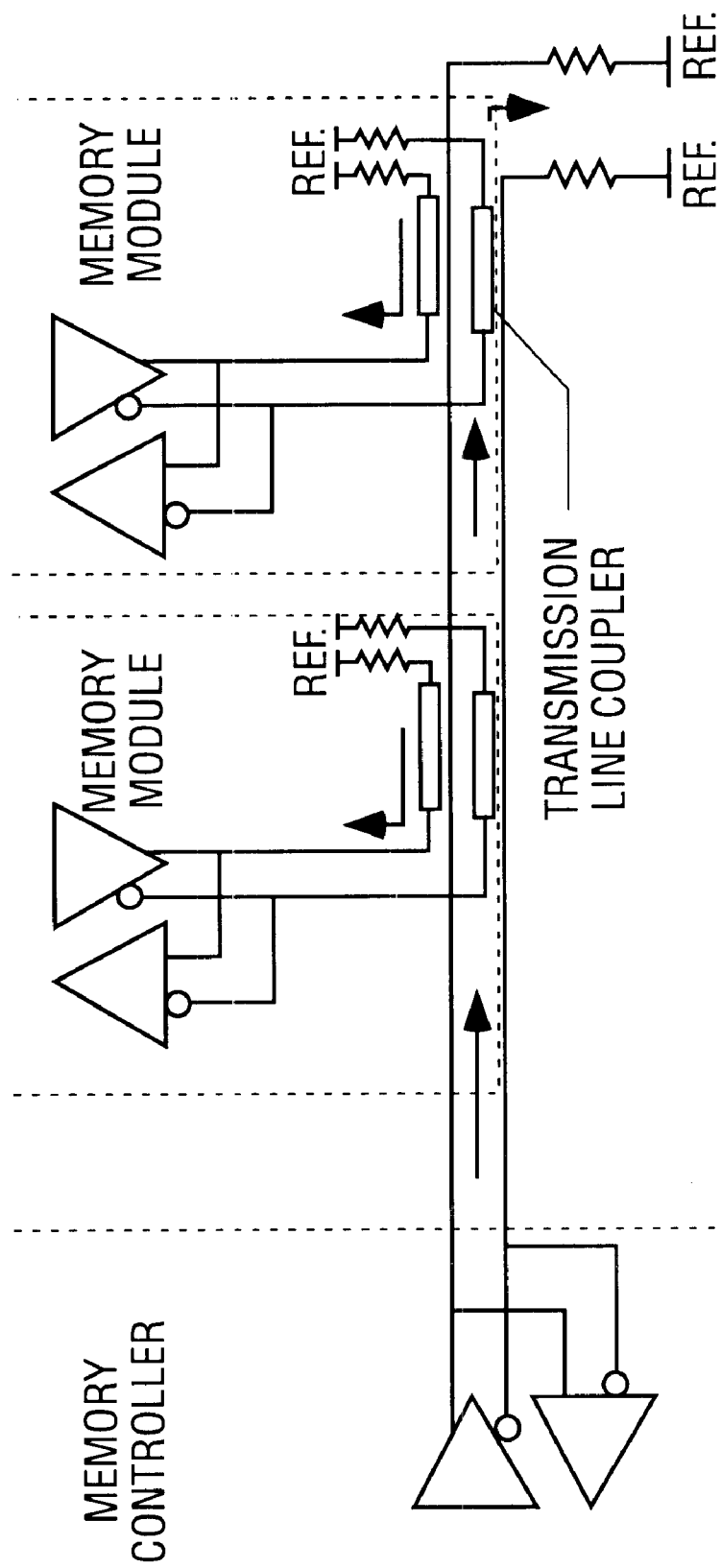

The ends 1114B and 1134B of each coupled conductor are terminated with matching resistors 1130, 1132 for high frequency operation, the ends 1114B and 1134B are selected to be the ends furthest from the motherboard transceiver 1110, because of signal directionality. Each daughter card has a transceiver 1120, 1122 connected to the end of the coupled conductor 1114A, 1134A, respectively. The transceiver 1110 transmits digital data which is received via the couplers 1140, 1141 by the daughter card transceivers 1120, 1122. Conversely, transceivers 1120, 1122 may separately transmit data through couplers 1140, 1141 for reception and decoding at transceiver 1110. FIG. 11B shows a differential version of the multiple couplers for a bus communication system.

This embodiment includes a data channel, such as a bus 1112, having substantially uniform electrical properties for transferring signals among devices that are coupled through the data channel. The uniform electrical properties are supported by an electromagnetic coupling scheme that allows higher frequency signaling to be employed without significantly increasing noise attributable to transmission line effects. This is achieved by ensuring that only a small amount of energy (e.g., less than 1%) is transferred between the bus and the coupled daughter card. A preferred embodiment of this system is constructed in such a way that daughter cards containing devices 1120 and 1122 may be removed from or inserted to the system with little effect on the communication bandwidth of the bus.

Figure 12A:
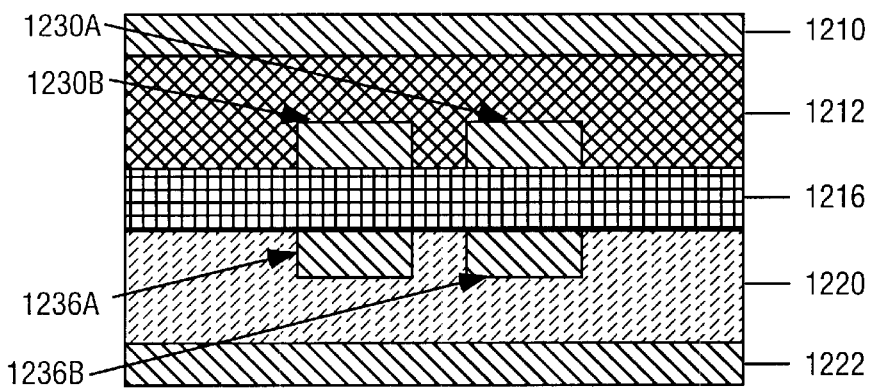
FIGS. 12A, 12B, 12C, and 12D show embodiments of a cross-section of a coupler.

FIG. 12A shows an embodiment of a cross-section of the coupler of FIG. 10A, shown at the point where the conductors cross. A differential pair of conductive signal traces 1230A and 1230B are coupled with another differential pair of conductive signal traces, 1236A and 1236B. Dielectric 1212 separates conductive signal traces 1230A and 1230B. Dielectric 1220 separates conductive signal traces 1236A and 1236B. Dielectric 1216 separates the differential pairs. Conductive reference planes 1210 and 1222 provide return paths for the conductive signal traces. The coupler may be constructed as an integral part of the computer motherboard. The conductive components 1230A, 1230B, 1236A, 1236B of the coupler with selected width (e.g., 5 mils) and thickness (e.g., 1.4 mils) may be constructed using conventional etching techniques on the surface of a dielectric sheet 1216. The sheet 1216 may have a preferred thickness (e.g., 3.5 mils) and dielectric constant (e.g., 4.5). Additional dielectric layers 1212 and 1220, with preferred thickness (e.g., 12 mils) and dielectric constant are added to provide the required spacing between the coupler elements 1230A, 1230B, 1236A, 1236B and the outer conductive reference planes 1210, 1222. The end connections to the motherboard coupled conductors can then be connected to the daughter card using conventional impedance controlled electrical connectors as is currently common practice.

By placing cross-coupled conductors of the coupler between upper and lower conductive reference planes, 1210 and 1222, as shown in FIG. 12A, a dual stripline structure is formed. Stripline structures have the same even mode propagation velocity (the velocity for the wave propagation mode between the conductors and the reference planes) as the odd mode propagation velocity (the velocity of the wave propagation mode between the individual conductors of the coupler). This results in broadband behavior, allowing the coupler to operate up to frequencies in the microwave region.

Figure 12B:
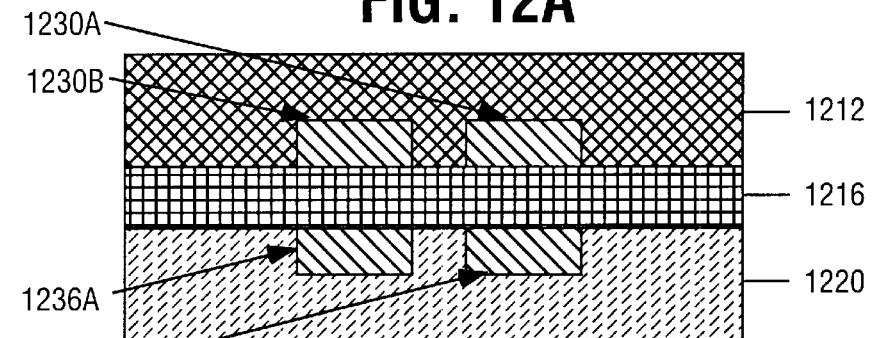

Alternatively, the coupler may include a microstrip reference plane, a coplanar reference plane, or may have no reference plane at all. One alternative embodiment is shown in FIG. 12B, which shows the two pairs of conductors 1230 and 1236 separated in a dielectric medium with no reference planes. This structure will form an EM coupler, however, it is not particularly suited for impedance control or wide bandwidth characteristics.

Figure 12C:
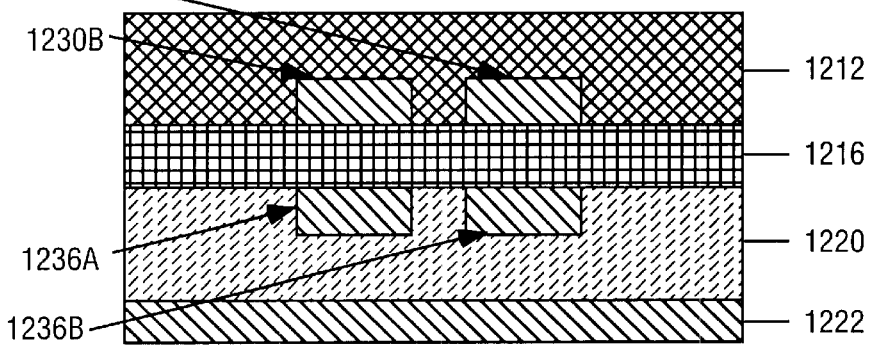
Figure 12D:
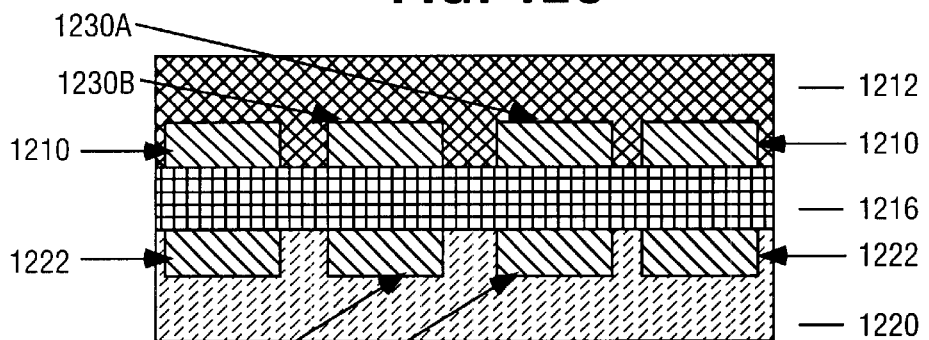

FIG. 12C shows a microstrip configuration for the coupler with both pairs of conductors 1230A, 1230B, and 1236A, 1236B referenced to a single reference plane 1222. This microstrip embodiment improves the impedance and bandwidth characteristics over that of FIG. 12B. Alternatively, a coplanar waveguide structure of FIG. 12D may be constructed with reference conductors 1210 and 1222 in the same plane as the corresponding conductive signal lines 1230A, 1230B and 1236A, 1236B.

The dielectrics in FIGS. 12A through 12D may be any dielectric material, for example air or FR4. The bandwidth may be improved by selecting dielectric materials with similar dielectric constants. In FIGS. 12A through 12D, conductors 1230A and 1230B may have a different width than conductors 1236A and 1236B. Also, dielectric 1212 may have a different thickness than dielectric 1220.

Figure 13:
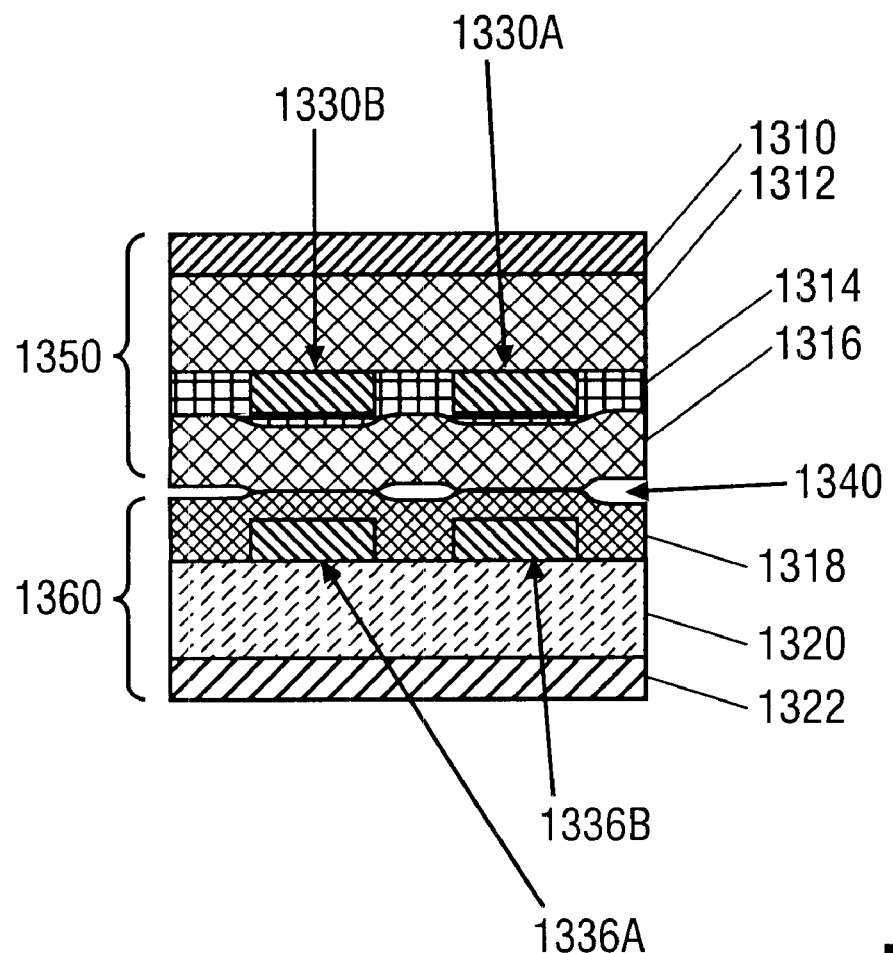
FIG. 13 shows another embodiment of a cross-section of a coupler.

A separable embodiment of the coupler of FIG. 10A is exemplified in the cross-sectional view of FIG. 13. In this embodiment, motherboard conductors 1336A and 1336B are constructed on the outer layers 1360 of a printed circuit card, with a width such as 8 mils for example, and a thickness of 2.1 mils for example. The daughter-board conductors 1330A and 1330B are contained in a flexible circuit 1350, which is pressed onto the surface of the motherboard. The conductors 1330A and 1330B may be 10 mils wide and 0.7 mils thick, for example. In FIG. 13, conductive reference plane 1322 is an internal power or ground plane as commonly used in printed circuit motherboards. The dielectric layer 1320 with preferred thickness and dielectric constant (e.g., 5 mils and 4.5, respectively) is used to provide the correct spacing between the motherboard conductive signal traces 1336A, 1336B and the conductive reference plane 1322.

The outer surface of the board may be coated with a thin dielectric coating or solder mask 1318, although this is not essential to the operation of the coupler. The daughter card portion of the coupler is provided with a conductive reference plane 1310 attached to the top surface of a flexible dielectric 1312 with preferred thickness (e.g., 2 mils) and dielectric constant (e.g., 4.5). The daughter card conductive signal traces 1330A, 1330B are constructed on the lower surface of the flexible dielectric 1312. A dielectric adhesive 1314 is used to attach a dielectric or cover-lay film 1316 with preferred thickness (e.g., 0.5 mils) and dielectric constant (e.g., 3.8). The required coupling coefficient is achieved by selecting the preferred thicknesses and dielectric constants for the dielectric 1316 when taking into the account the expected manufacturing variations in the dielectric coating 1318 and airgaps 1340 in addition to other variations in the coupler geometry and materials.

Although FIG. 13 shows a dual stripline embodiment, alternatives such as a microstrip embodiment, a coplanar embodiment, or an embodiment without a reference plane may be used, as discussed above. Furthermore, conductors 1330A and 1330B may be a different width than conductors 1336A and 1336B. Also, dielectric 1312 may be different thickness than dielectric 1320.

Figure 14:
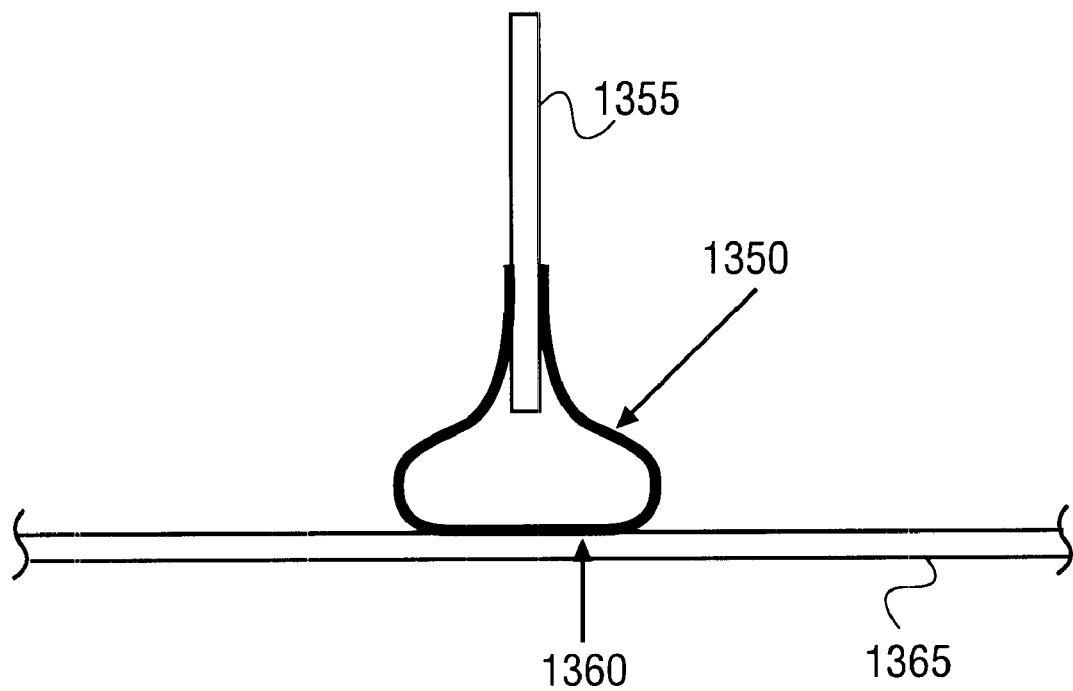
FIG. 14 shows an orthogonal view of the cross-section shown in FIG. 13.

FIG. 14 shows a view in the plane orthogonal to that of FIG. 13. The flexible circuit 1350 for daughter card 1355 is folded into a circular loop, with the longitudinal axis of the signal conductors 1330A and 1330B lying along the loop circumference. The ends of the conductive signal traces 1330A and 1330B are connected to conductive etches on the two outer faces of the daughter card 1355 in order to provide connection to the transceiver and terminating resistors mounted on the daughter card 1355.

The loop is then pressed onto the top surface of the motherboard 1365 so that the longitudinal axes of each motherboard conductor 1336A and 1336B is parallel with, and in the desired proximity to, the corresponding coupled flex circuit conductor. The length of the flexible circuit and vertical position of the daughter card are adjusted by mechanical means such that the motherboard conductors are in the desired proximity to the flex circuit conductors for a length L, which is selected to ensure that the capacitive and inductive coupling coefficients fall within the desired range of values. The length L may be 1 cm for example.

Some bandwidth reduction may be present in the flex strip implementation of FIG. 14 if the flex strip is made of polyimide (dielectric constant=3.8) and the motherboard is made of FR4 glass-epoxy (dielectric constant=4.5). These materials are commercially available from well-known vendors such as 3M or DuPont. This may be eliminated if the FR4 is replaced with a material with a dielectric constant equal or close to that of polyimide, like Rogers RO4003 or similar lower dielectric constant materials. Rogers RO4003 is available from the Rogers Corporation. In the embodiment where the coupler is buried in the motherboard, the bandwidth may be limited by the dielectric losses in the FR4 material used in low-cost PCB assemblies. Again, the use of materials with lower dielectric losses like Rogers RO4003 relieves these limits.

Figure 15:
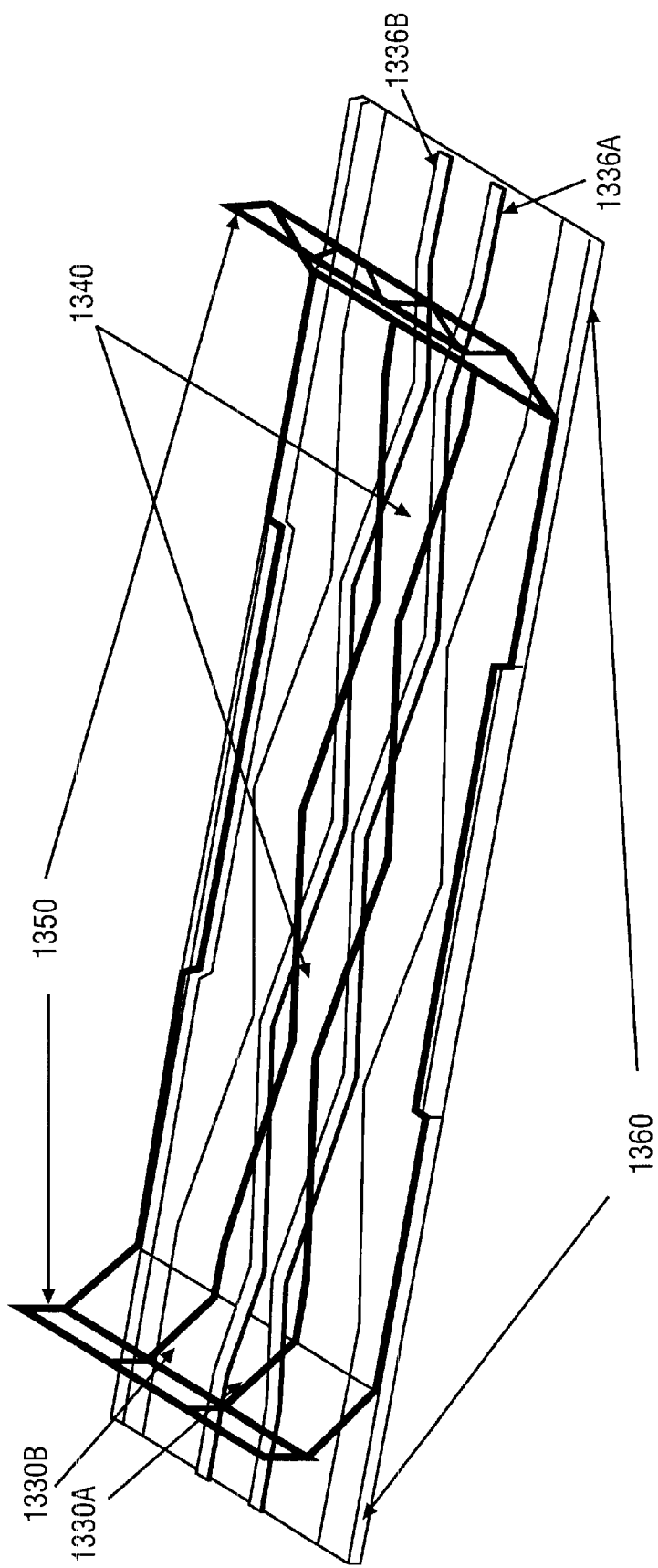
FIG. 15 shows an embodiment of a coupler on a motherboard and a flex circuit.

FIG. 15 shows a detail of the contact area between the flexible circuit and the top surface of the motherboard corresponding to the embodiment outlined in FIGS. 13 and 14. Arranging the motherboard conductors 1336A, 1336B, in selected proximity to the flex circuit conductors 1330A, 1330B, creates the coupler. The motherboard-connected segments are lying in a plane where adjacent segments are arranged with an alternating angular displacement about the longitudinal axis of the conductor. The flex circuit conductors, similarly segmented, are arranged so that the angular displacements of its segments are in opposite sense to the corresponding segments in the motherboard. The composite structure may thus have the zig-zag geometry as shown in FIG. 6A.

These and other embodiments of the present invention may be realized in accordance with these teachings and it should be evident that various modifications and changes may be made in these teachings without departing from the broader spirit and scope of the invention. The specification and drawings are, accordingly, to be regarded in an illustrative rather than restrictive sense and the invention measured only in terms of the claims.

What is claimed is:

1. Apparatus, comprising:
   a first transmission structure; and
   a second transmission structure having a plurality of transmission sections, each transmission section having an angle of deflection relative to an axis parallel to the second transmission section, wherein the angle is selected such that, when the second transmission structure is positioned proximate to the first transmission structure to form an electromagnetic coupler, a total capacitance between the first and second transmission structures is maintained relatively constant over a range of relative positions of the first and second transmission structures.

2. The apparatus of claim 1, wherein the angle of deflection forms a fringe capacitance and a parallel plane capacitance between the first and second transmission structures when the first and second transmission structures are positioned proximate to each other, and wherein the fringe capacitance and the parallel plane capacitance, in combination, maintain the total capacitance relatively constant over the range of relative positions of the first and second transmission structures.

3. The apparatus of claim 1, wherein the angle of deflection is an other than 90° angle.

4. The apparatus of claim 1, wherein the second transmission structure comprises at least one differential pair of conductors parallel to each other.

5. The apparatus of claim 1, wherein the second transmission structure includes a zig-zag geometry and the first transmission structure includes a straight geometry, and wherein the first transmission structure dielectrically crosses the second transmission structure at multiple locations due to the angle of deflection.

6. The apparatus of claim 1, further comprising a planar conductive reference plane parallel to a plane containing the second transmission structure, the planar conductive reference plane providing a reference potential to the second transmission structure.

7. The apparatus of claim 1, wherein the first and second transmission structures are able to transfer signals in an electronic system.

8. The apparatus of claim 7, wherein the electronic system is a member selected from the group consisting of:

a computer system;

a computer bus;

a computer motherboard;

a daughter card;

a multi-chip module;

an integrated circuit;

a flex circuit;

a printed circuit board; and a cable circuit.

* * * * *